United States Patent
Jia et al.

(10) Patent No.: US 11,968,829 B2
(45) Date of Patent: Apr. 23, 2024

(54) METHOD OF FORMING MEMORY CELLS, HIGH VOLTAGE DEVICES AND LOGIC DEVICES ON A SEMICONDUCTOR SUBSTRATE

(71) Applicant: Silicon Storage Technology, Inc., San Jose, CA (US)

(72) Inventors: Zhuoqiang Jia, Mountain View, CA (US); Leo Xing, Shanghai (CN); Xian Liu, Sunnyvale, CA (US); Serguei Jourba, Aix en Provence (FR); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 102 days.

(21) Appl. No.: 17/834,746

(22) Filed: Jun. 7, 2022

(65) Prior Publication Data
US 2023/0292504 A1 Sep. 14, 2023

Related U.S. Application Data

(60) Provisional application No. 63/318,657, filed on Mar. 10, 2022.

(51) Int. Cl.
*H10B 41/42* (2023.01)
*H01L 21/28* (2006.01)
(Continued)

(52) U.S. Cl.
CPC ........ *H10B 41/42* (2023.02); *H01L 29/40114* (2019.08); *H01L 29/42328* (2013.01); *H01L 29/66825* (2013.01); *H01L 29/7883* (2013.01)

(58) Field of Classification Search
None
See application file for complete search history.

(56) References Cited

U.S. PATENT DOCUMENTS 6,747,310 B2  6/2004  Fan
7,390,718 B2  6/2008  Roizin
(Continued)

FOREIGN PATENT DOCUMENTS

TW   200723543   6/2007
TW   201338101   9/2013
WO   2017 014866  1/2017

OTHER PUBLICATIONS

PCT Search Report and Written Opinion dated Nov. 29, 2022 corresponding to the related PCT Patent Application No. US2022/033309.

(Continued)

*Primary Examiner* — Xiaoming Liu
(74) *Attorney, Agent, or Firm* — DLA Piper LLP (US)

(57) ABSTRACT

A method includes recessing an upper surface of a substrate in first and second areas relative to a third area, forming a first conductive layer in the first area, forming a second conductive layer in the three areas, selectively removing the first and second conductive layers in the first area, while maintaining the second conductive layer in the second and third areas, leaving pairs of stack structures in the first area respectively having a control gate of the second conductive layer and a floating gate of the first conductive layer, forming a third conductive layer in the three areas, recessing the upper surface of the third conductive layer below tops of the stack structures and removing the third conductive layer from the second and third areas, removing the second conductive layer from the second and third areas, and forming blocks of metal material in the second and third areas.

8 Claims, 18 Drawing Sheets

(51) Int. Cl.
*H01L 29/423* (2006.01)
*H01L 29/66* (2006.01)
*H01L 29/788* (2006.01)

(56) References Cited

U.S. PATENT DOCUMENTS

| | | |
|---|---|---|
| 7,439,133 B2 | 10/2008 | Chou |
| 7,868,375 B2 | 1/2011 | Liu |
| 7,927,994 B1 | 4/2011 | Liu |
| 8,173,514 B2 | 5/2012 | Ogura |
| 9,082,865 B2 | 7/2015 | Yu |
| 9,214,354 B2 | 12/2015 | Ishida |
| 9,219,134 B2 | 12/2015 | Fukumoto |
| 9,224,745 B2 | 12/2015 | Torii |
| 9,230,977 B2 | 1/2016 | Wu |
| 9,269,766 B2 | 2/2016 | Wu |
| 9,276,005 B1 | 3/2016 | Zhou |
| 9,412,599 B2 | 8/2016 | Ishida |
| 9,412,755 B2 | 8/2016 | Ishida |
| 9,496,369 B2 | 11/2016 | Wu |
| 9,721,958 B2 | 8/2017 | Yang |
| 2005/0186741 A1 | 8/2005 | Roizin |
| 2009/0039410 A1 | 2/2009 | Liu |
| 2009/0215243 A1 | 8/2009 | Ogura |
| 2010/0054043 A1 | 3/2010 | Liu |
| 2012/0299056 A1 | 11/2012 | Arai |
| 2013/0171814 A1 | 7/2013 | Torii |
| 2013/0242659 A1 | 9/2013 | Yu |
| 2015/0084111 A1 | 3/2015 | Wu |
| 2015/0171101 A1 | 6/2015 | Ishida |
| 2015/0171102 A1 | 6/2015 | Ishida |
| 2015/0171103 A1 | 6/2015 | Ishida |
| 2016/0043095 A1 | 2/2016 | Yang |
| 2016/0126327 A1 | 5/2016 | Chen |
| 2016/0148944 A1 | 5/2016 | Yu |
| 2016/0163722 A1 | 6/2016 | Chang |
| 2016/0181266 A1 | 6/2016 | Chuang |
| 2019/0172942 A1 | 6/2019 | Yang |
| 2020/0381442 A1 | 12/2020 | Wu et al. |
| 2021/0013220 A1 | 1/2021 | Lin |
| 2021/0202721 A1* | 7/2021 | Wu ................. H10B 41/50 |
| 2022/0052059 A1* | 2/2022 | Wang ............ H01L 29/66825 |

OTHER PUBLICATIONS

PCT Search Report dated Nov. 24, 2021 corresponding to PCT Patent Application No. US2021 036311.

U.S. Appl. No. 17/339,880, filed Jun. 4, 2021 entitled "Method of Forming a Semiconductor Device with Memory Cells, High Voltage Devices and Logic Devices on a Substrate," Song, et al.

* cited by examiner

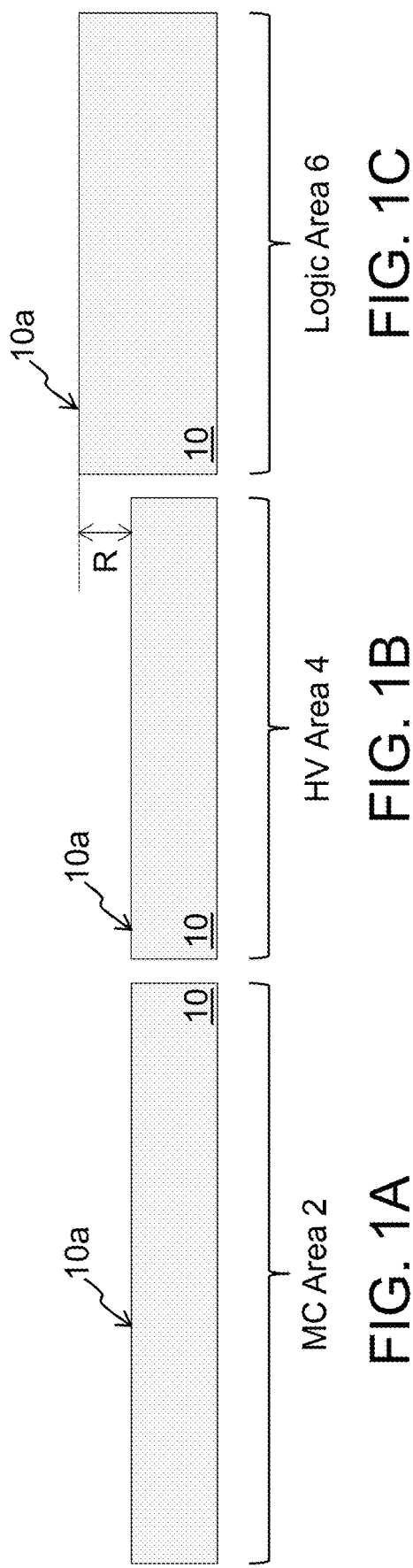

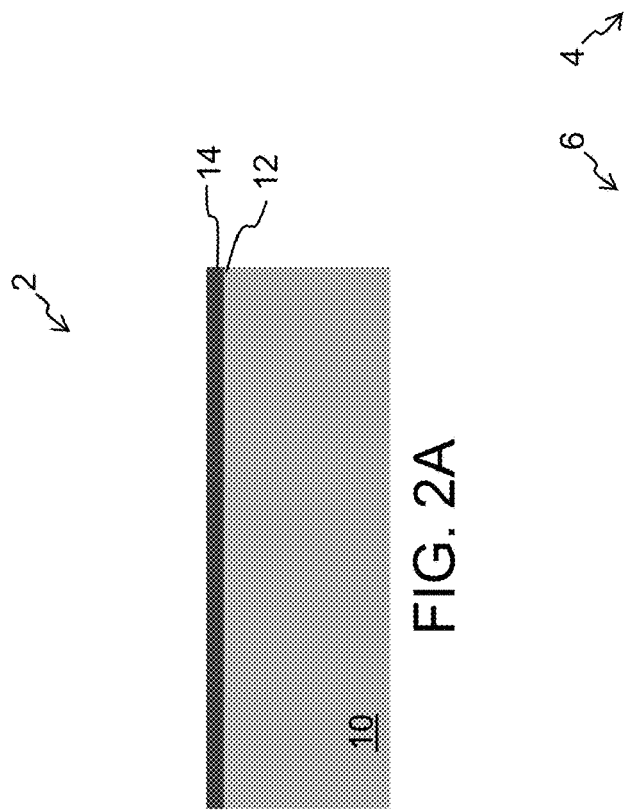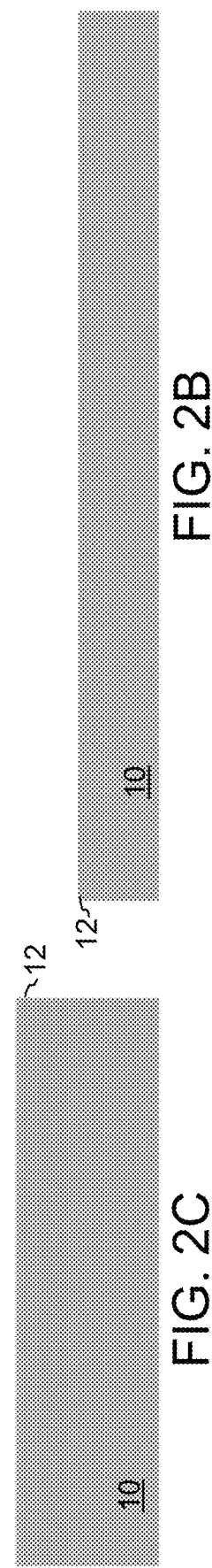

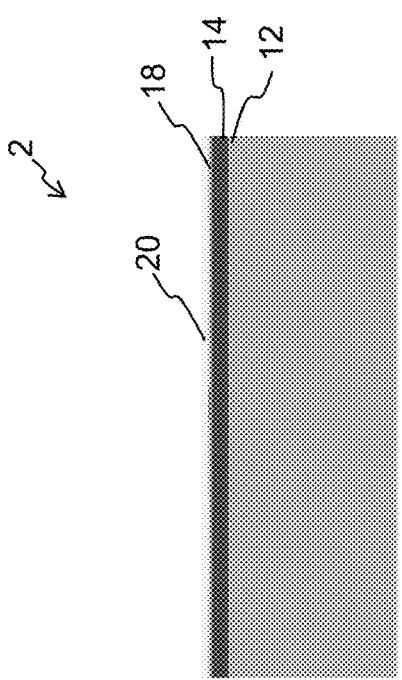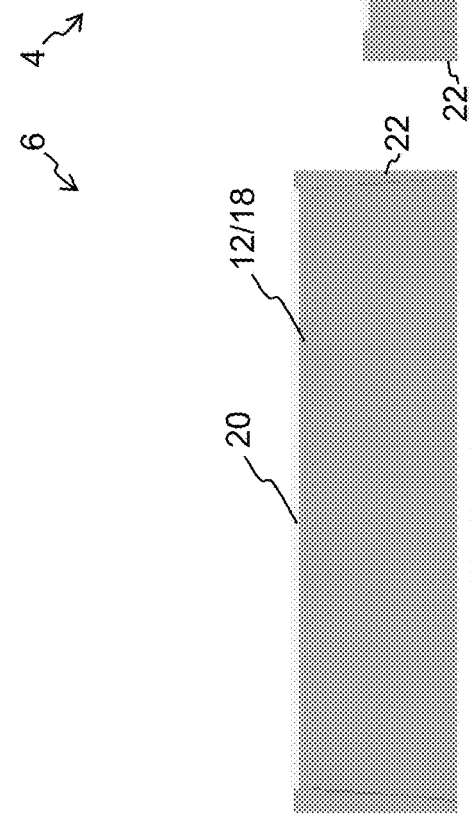

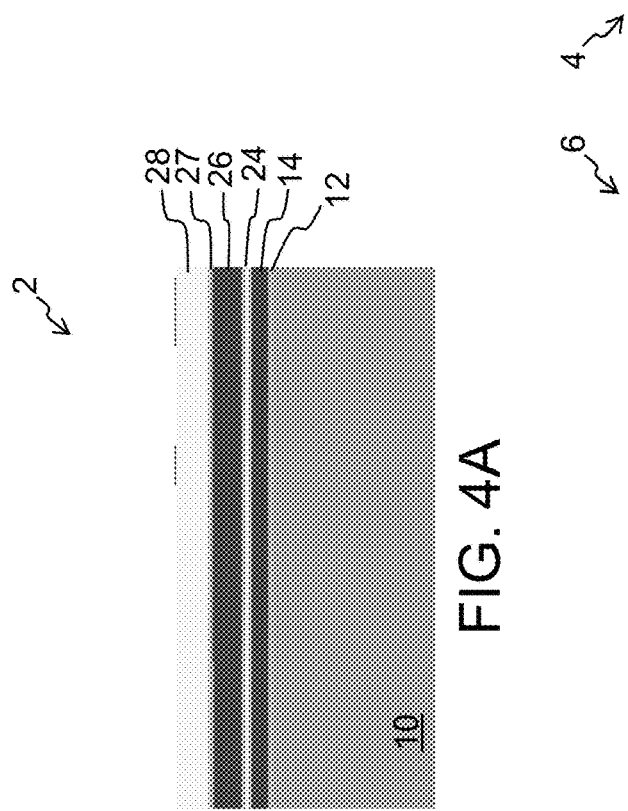
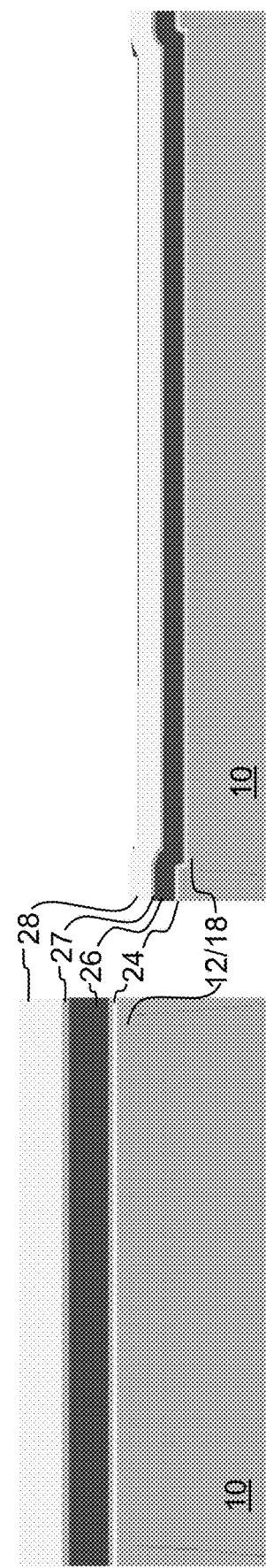

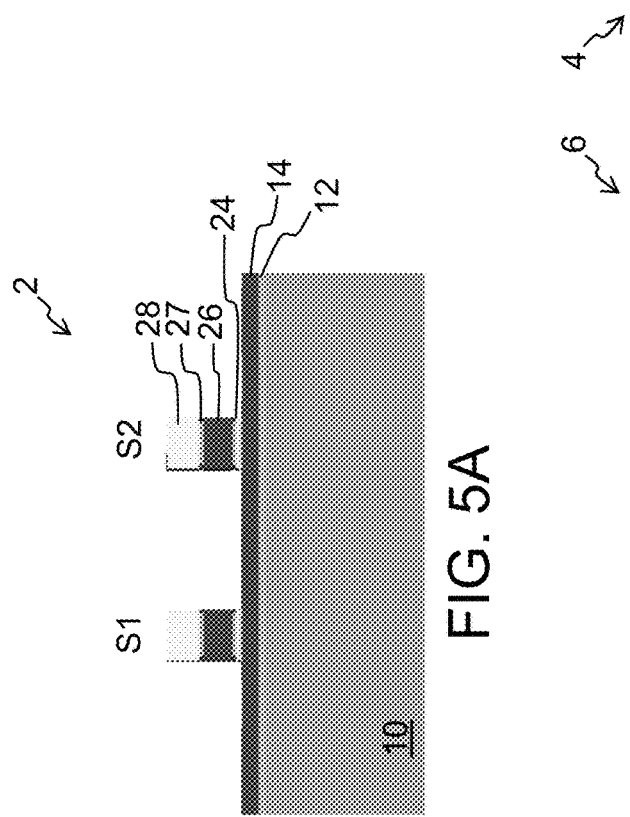
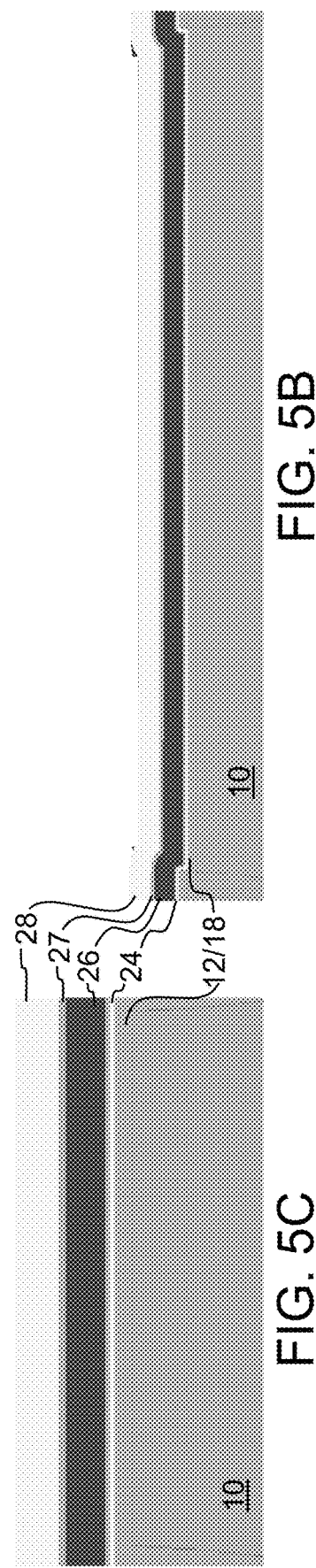

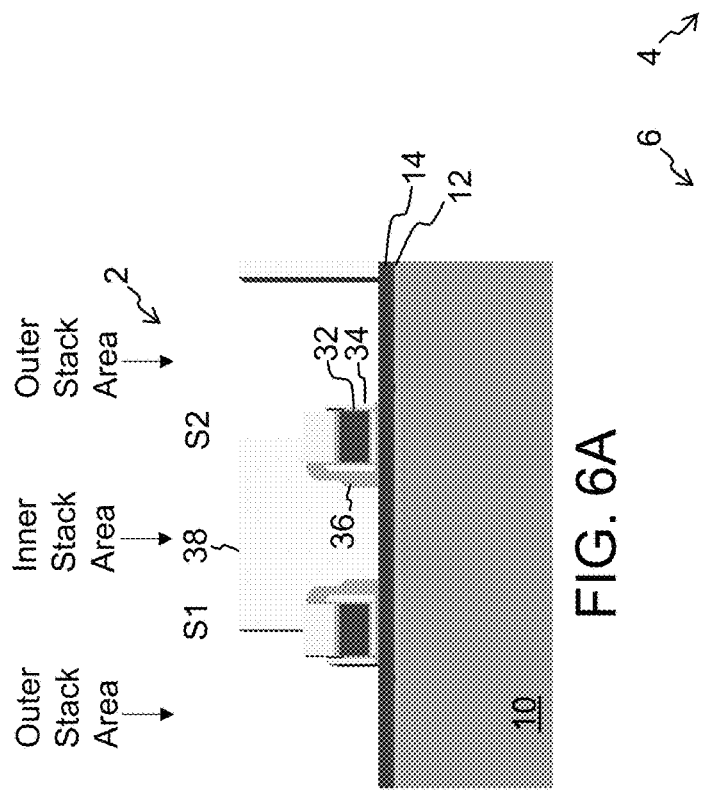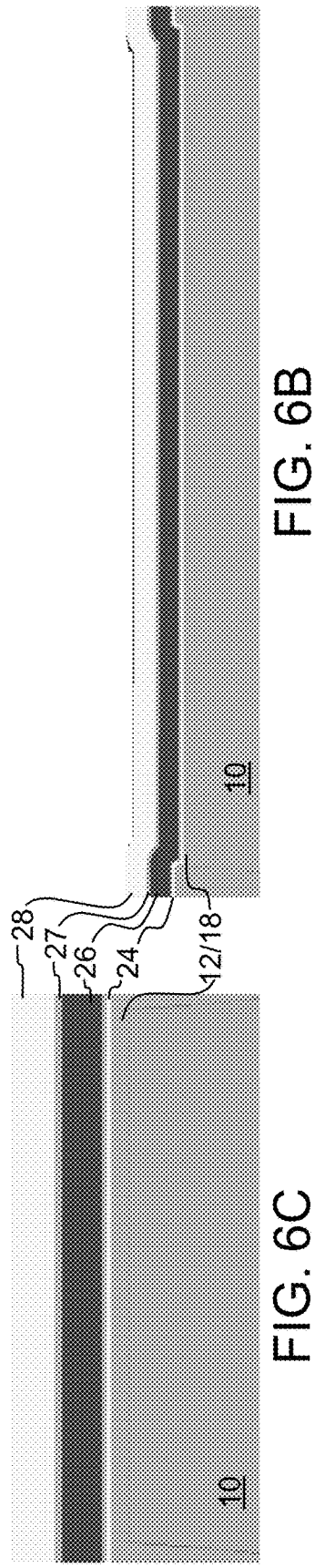

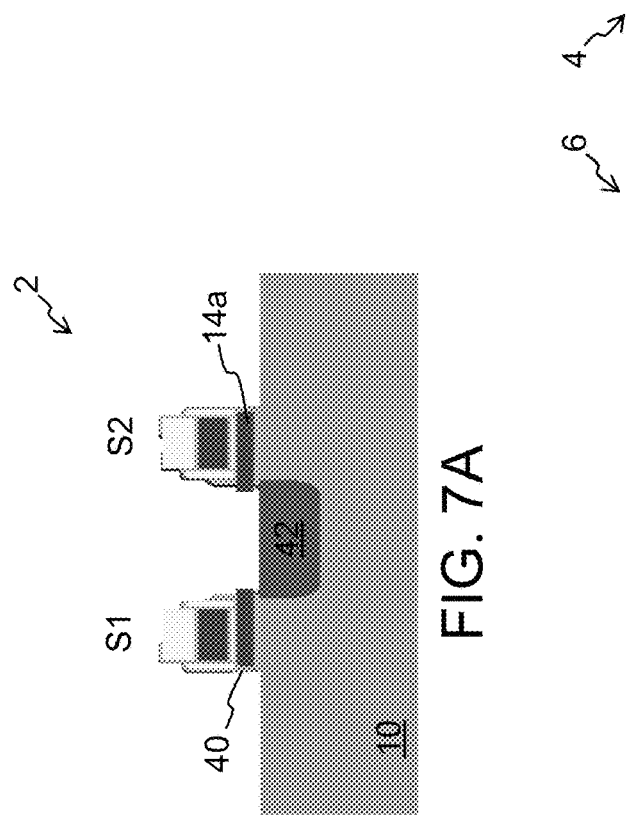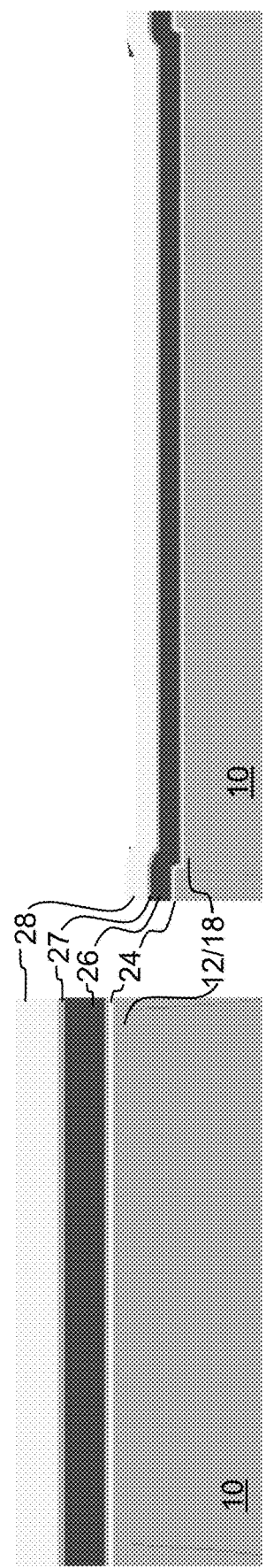

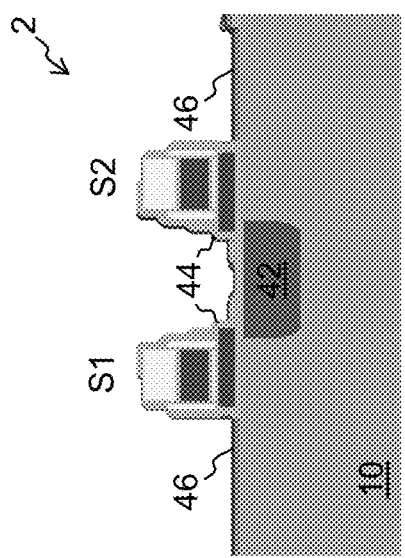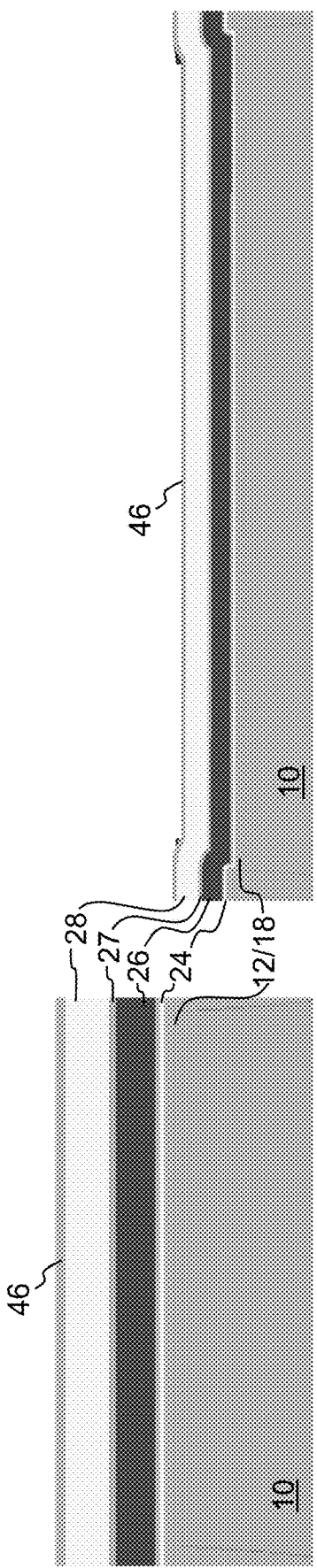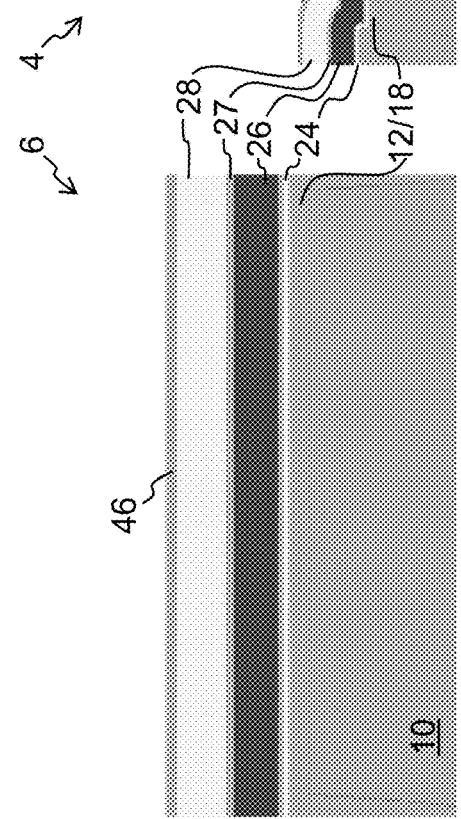
FIG. 8A
FIG. 8B
FIG. 8C

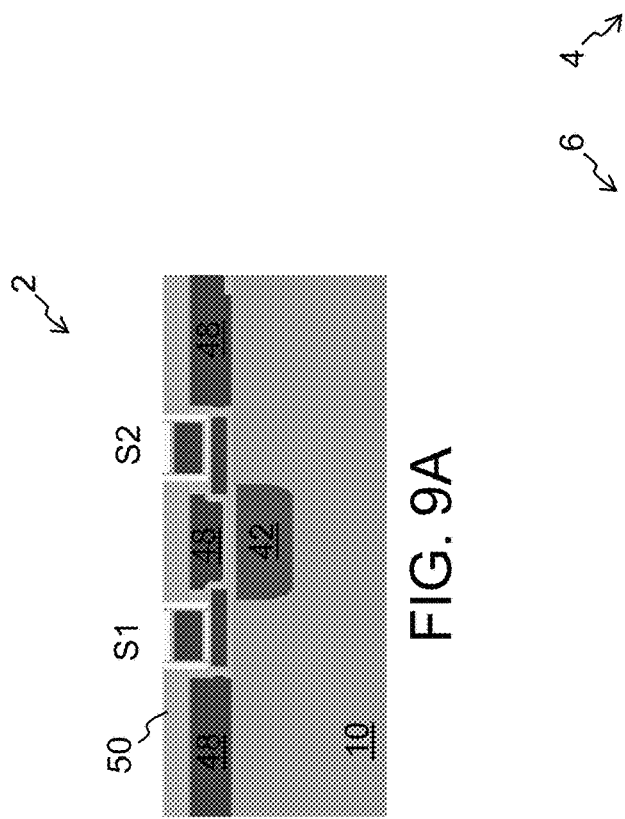
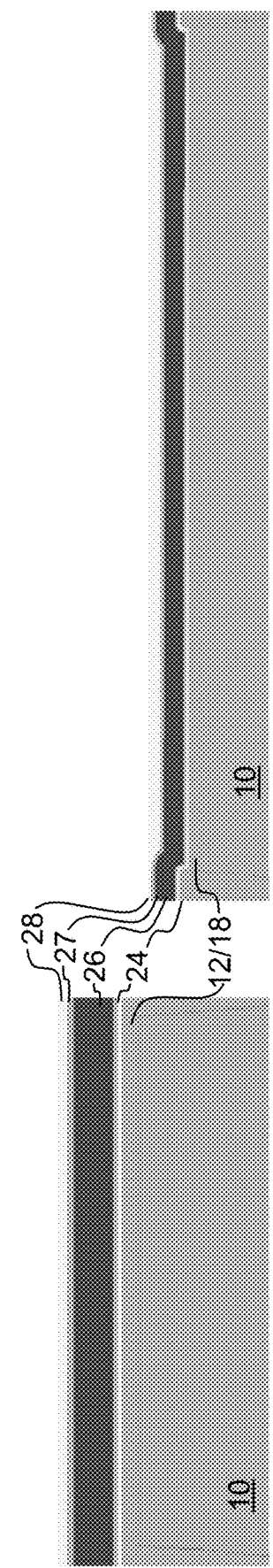
FIG. 9A
FIG. 9B
FIG. 9C

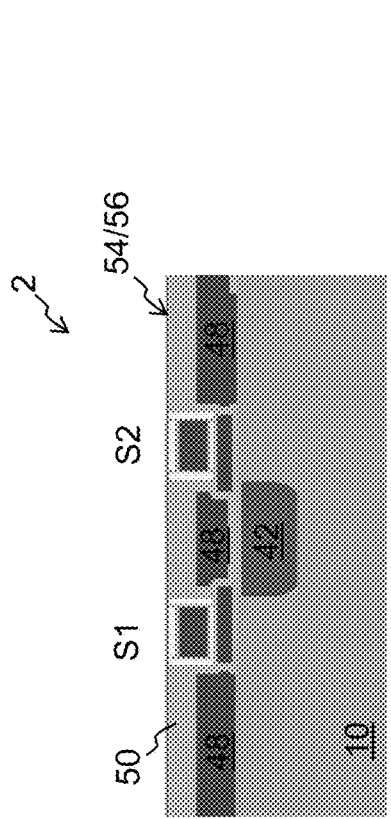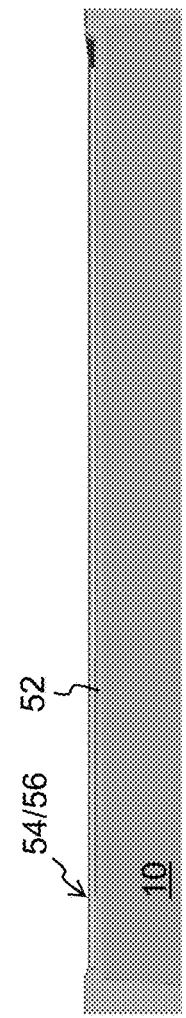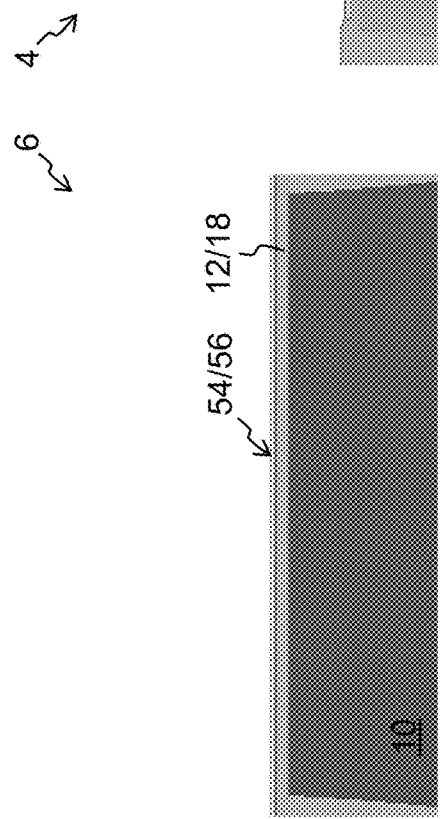
FIG. 11A
FIG. 11B
FIG. 11C

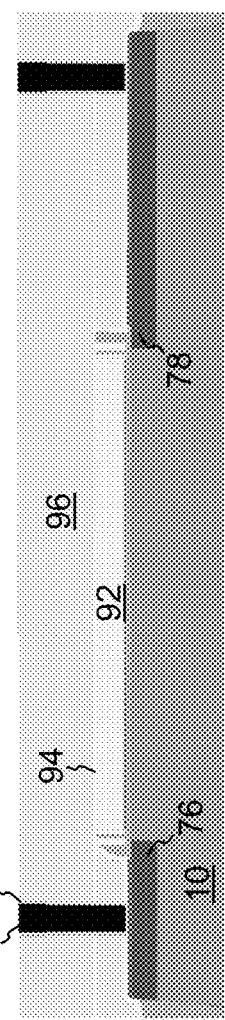
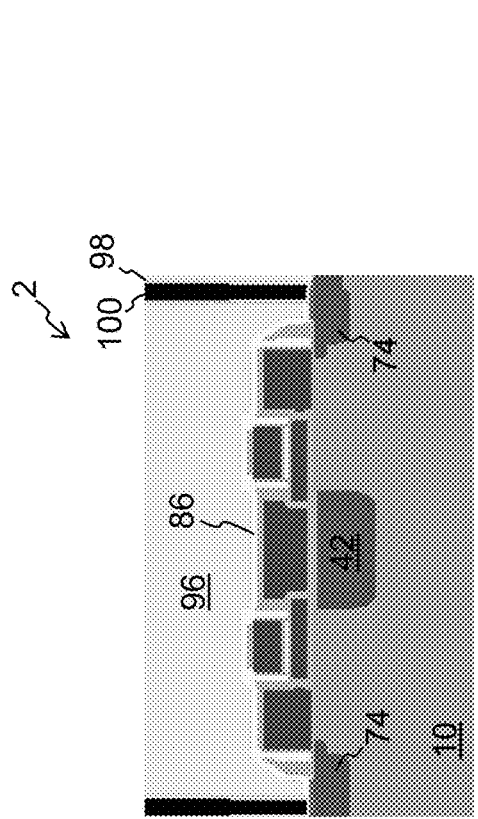
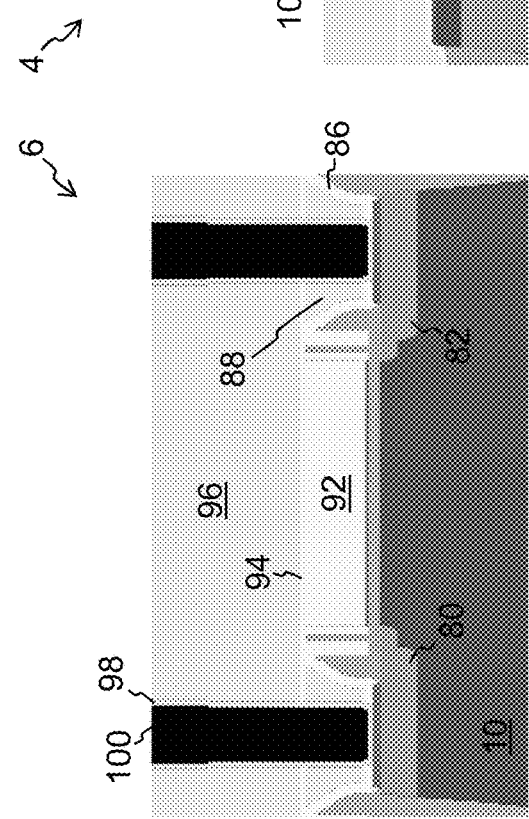
FIG. 14A
FIG. 14B
FIG. 14C

METHOD OF FORMING MEMORY CELLS, HIGH VOLTAGE DEVICES AND LOGIC DEVICES ON A SEMICONDUCTOR SUBSTRATE

RELATED APPLICATIONS

This application claims the benefit of U.S. Provisional Application No. 63/318,657, filed Mar. 10, 2022, and which is incorporated herein by reference.

FIELD OF THE INVENTION

The present disclosure relates to semiconductor devices with non-volatile memory cells embedded on the same substrate as logic devices and high voltage devices.

BACKGROUND OF THE INVENTION

Non-volatile memory semiconductor devices formed on silicon semiconductor substrates are known. For example, U.S. Pat. Nos. 6,747,310, 7,868,375 and 7,927,994 disclose memory cells with four gates (floating gate, control gate, select gate and erase gate) formed on a semiconductor substrate, which are incorporated herein by reference for all purposes. Source and drain regions are formed as diffusion implant regions into the substrate, defining a channel region therebetween in the substrate. The floating gate is disposed over and controls the conductivity of a first portion of the channel region, the select gate is disposed over and controls the conductivity of a second portion of the channel region, the control gate is disposed over the floating gate (for capacitively coupling therewith), and the erase gate is disposed over the source region and laterally adjacent to the floating gate.

It is also known to form low and high voltage logic devices on the same substrate as the non-volatile memory cells. See for example U.S. Pat. No. 9,276,005, which is incorporated herein by reference for all purposes. New gate materials such as high K dielectric and metal gates are also used to increase performance. However, processing operations in forming the memory cells can adversely affect the concurrently fabricated logic devices, and vice versa.

There is a need for an improved method of making a device that includes memory cells, low voltage logic devices and high voltage devices on the same substrate.

BRIEF SUMMARY OF THE INVENTION

The aforementioned problems and needs are addressed by a method of forming a semiconductor device that includes:
providing a substrate of semiconductor material that includes a first area, a second area and a third area;
recessing an upper surface of the substrate in the first area and an upper surface of the substrate in the second area, relative to an upper surface of the substrate in the third area;
forming a first conductive layer disposed over and insulated from the upper surfaces in the first area, the second area and the third area; removing the first conductive layer from the second area and the third area;
forming an insulation layer on the first conductive layer in the first area and over the upper surfaces in the second area and the third area;
forming a second conductive layer on the insulation layer in the first area, the second area and the third area;
performing one or more etches to selectively remove portions of the first and second conductive layers in the first area, while maintaining the second conductive layer in the second area and the third area, wherein the one or more etches result in pairs of stack structures in the first area with the respective stack structures including a control gate of the second conductive layer disposed over and insulated from a floating gate of the first conductive layer;
forming first source regions in the substrate of the first area, respective first source regions disposed between respective pairs of stack structures;
forming a third conductive layer disposed over and between the stack structures in the first area, and in the second area and the third area;
performing a chemical mechanical polish or etch back to planarize an upper surface of the third conductive layer;
performing an etch to recess the upper surface of the third conductive layer below tops of the stack structures in the first area, and to remove the third conductive layer from the second area and the third area, leaving a plurality of erase gates of the third conductive layer respectively disposed over and insulated from one of the first source regions in the first area;
removing the second conductive layer from the second area and the third area;
after the removing of the second conductive layer from the second area and the third area, forming blocks of dummy conductive material disposed over and insulated from the upper surfaces in the second area and the third area;
after the forming of the blocks of dummy conductive material in the second area and the third area, etching portions of the third conductive layer in the first area to form a plurality of select gates of the third conductive layer each disposed adjacent to one of the stack structures;
forming first drain regions in the substrate of the first area, the first drain regions respectively adjacent to one of the select gates;
forming second source regions in the substrate, the second source regions respectively adjacent one of the blocks of dummy conductive material in the second area;
forming second drain regions in the substrate, the second drain regions respectively adjacent one of the blocks of dummy conductive material in the second area;
forming third source regions in the substrate, the third source regions respectively adjacent one of the blocks of dummy conductive material in the third area;
forming third drain regions in the substrate, the third drain regions respectively adjacent one of the blocks of dummy conductive material in the third area; and
replacing the blocks of dummy conductive material in the second area and in the third area with blocks of metal material.

Other objects and features of the present disclosure will become apparent by a review of the specification, claims and appended figures.

BRIEF DESCRIPTION OF THE DRAWINGS

FIGS. 1A-14A are cross sectional views of the memory cell area showing the formation of the memory cells.

FIGS. 1B-14B are cross sectional views of the HV area showing the formation of the HV devices.

FIGS. 1C-14C are cross sectional views of the logic area showing the formation of the logic devices.

DETAILED DESCRIPTION OF THE INVENTION

Figure 10A:
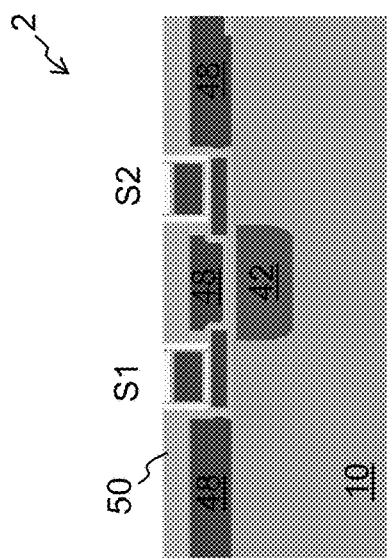

A process of forming a semiconductor device by simultaneously forming memory cells, low voltage logic devices and high voltage logic devices on the same semiconductor substrate is disclosed. The process described below involves forming memory cells in one or more memory cell areas 2 (also referred to as first area 2 or MC area 2) of the substrate 10, high voltage logic devices (also referred to herein as HV devices) in one or more high voltage logic device areas 4 (also referred to as second area 4 or HV area 4) of the substrate 10, and low voltage logic devices (also referred to herein as LV devices) in one or more low voltage logic device areas 6 (also referred to a third area 6 or logic area 6) of the substrate 10. The process is described with respect to forming a pair of memory cells in an MC area 2, a high voltage logic device in an HV area 4, and low voltage logic device in a logic area 6, simultaneously. However, multiple such devices in each area may be simultaneously formed. Substrate 10 is a substrate of semiconductor material (e.g., silicon). For the purposes of this disclosure, the high voltage logic device (HV device) is one with an operational voltage that is higher than that of the low voltage logic device (LV device).

Referring to FIGS. 1A-14A for the MC area 2, FIGS. 1B-14B for the HV area 4, and FIGS. 1C-14C for the logic area 6, there are shown cross-sectional views of the operations in the process to make a semiconductor device. The process begins by recessing the upper surface 10a of the silicon substrate 10 in the MC area 2 and HV area 4 by a recess amount R relative to the logic area 6. Recessing the substrate upper surface 10a may be performed by forming a silicon dioxide (also referred to herein as "oxide") layer on the substrate upper surface 10a and a silicon nitride (also referred to herein as "nitride") layer on the oxide layer. A photolithography masking operation is performed to cover the logic area 6 but not the MC and HV areas 2/4 with photoresist (i.e., form photoresist over all three areas, selectively expose portion(s) of the photoresist, and selectively remove portion(s) of the photoresist, leaving exposed portion(s) of the underlying structure (in this case the nitride layer in the MC and HV areas 2/4), while leaving other portion(s) of the underlying structure covered by the photoresist (in this case the nitride layer in the logic area 6). Nitride and oxide etches are performed to remove these layers from the MC and HV areas 2/4, leaving the upper surface 10a in these areas exposed. After photoresist removal, a silicon etch is then performed to effectively lower the upper surface 10a in the MC and HV areas 2/4 by recess amount R. Nitride and oxide etches are then used to remove all the oxide and nitride layers from logic area 6, resulting in the structure shown in FIGS. 1A, 1B and 1C. The upper surface 10a in the MC and HV areas 2/4 is recessed by recess amount R (e.g., ~300 A) relative to the upper surface 10a in the logic area 6. Alternatively or additionally, surface 10a in the MC and HV areas 2/4 can be recessed by thermal oxidation, which consumes a portion of the upper surface 10a.

Next, an oxide layer 12 is formed on the upper surface 10a (e.g., by deposition or by thermal growth). Thereafter, a conductive layer 14 (also referred to herein as first conductive layer) is formed on oxide layer 12. Conductive layer 14 can be polysilicon or amorphous silicon, either in-situ doped or undoped. A photolithography masking operation is then performed to cover the MC area 2 with photoresist, but leaving the HV and logic areas 4/6 exposed (i.e., the photoresist is removed from the HV and logic areas 4/6 as part of the masking operation). An etch is used to remove conductive layer 14 from the HV and logic areas 4/6. The resulting structure is shown in FIGS. 2A, 2B and 2C (after photoresist removal).

Oxide layer 18 is formed on conductive layer 14 in the MC area 2 and on the oxide layer 12 in the HV and logic areas 4/6. An insulation layer 20 such as nitride (also referred to herein as hard mask insulation layer 20) is formed on oxide layer 18. A photolithography masking operation is used to selectively cover portions of each area with photoresist, leaving portions of the nitride layer exposed in each area. Etches such as nitride, oxide, polysilicon, and silicon etches are used to form trenches through hard mask insulation layer 20, oxide layer 18, conductive layer 14 (in the MC area 2), oxide layer 12 and into silicon substrate 10. The trenches are then filled with oxide 22 by oxide deposition and chemical mechanical polish (CMP). Oxide 22 is an insulation material that can also be referred to as STI (shallow trench isolation) oxide 22. STI oxide 22 can include a liner oxide formed by thermal oxidation before the oxide deposition. The resulting structure is shown in FIGS. 3A, 3B and 3C (after photoresist removal). The trenches filled with oxide 22 extend parallel to active regions in the MC area 2, and because FIG. 3A is a cross sectional view of one of the active regions, the trenches filled with oxide 22 are not shown in FIG. 3A.

The hard mask insulation layer 20 is removed by a nitride etch. A series of implants can be performed to create the desired wells in the substrate 10 in each of the areas 2/4/6 (after a respective photolithography masking operation to selectively cover one or more of the other areas with photoresist during each implantation). After removal of the photoresist from the implant stage, and a respective photolithography masking operation to cover the HV and logic areas 4/6 with photoresist and leave the MC area 2 exposed, an oxide etch recesses the STI oxide 22 and removes oxide layer 18 from the MC area 2. After photoresist removal, an insulation layer 24 is then formed over the structure. Insulation layer 24 can be an ONO composite layer with oxide/nitride/oxide sublayers (formed by oxide, nitride, oxide depositions and anneal). However, insulation layer 24 could instead be formed of a composite of other dielectric layers, or a single dielectric material with no sublayers. A conductive layer 26 (also referred to herein as second conductive layer) is then formed on the structure, in one example by deposition. Conductive layer 26 can be polysilicon, or can be amorphous silicon, either in-situ doped or undoped. An implantation and anneal is performed if polysilicon or undoped amorphous silicon is used for conductive layer 26. One or more hard mask layers are then formed on conductive layer 26. Specifically, in one example, an oxide layer 27 is formed on conductive layer 26, and a nitride layer 28 is formed on oxide layer 27. The resulting structure is shown in FIGS. 4A, 4B and 4C.

A respective photolithography masking operation is used to form photoresist on the structure, where it is selectively removed from the MC area 2, to expose portions of nitride layer 28 in the MC area 2. A series of etches are used to remove exposed portions of nitride layer 28, oxide layer 27, conductive layer 26 and insulation layer 24, which result in pairs of spaced apart stack structures S1 and S2 of nitride layer 28, oxide layer 27, conductive layer 26 and insulation layer 24 that are maintained in the MC area 2. The resulting structure is shown in FIGS. 5A, 5B and 5C (after photoresist removal).

Oxide spacers 32, nitride spacers 34 and oxide spacers 36 are formed on the sides of stacks S1 and S2 in the MC area 2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, oxide spacers 32 and nitride spacers 34 are formed by an oxide deposition, a nitride deposition, and then one or more anisotropic etches. Then, oxide spacers 36 are formed by oxide deposition and etch. The planar nitride layer 28 in the HV and logic areas 4/6 is largely unaffected by this spacer formation. A photolithographic masking operation is used to cover the MC area 2 with photoresist 38, including the area between the stacks S1 and S2 (referred to herein as the inner stack area) and in the areas on the other sides of stack structures S1 and S2 from the inner stack area (referred to herein as the outer stack areas). The photoresist 38 is removed from the outer stack areas. An oxide etch is used to remove the oxide spacers 36 facing the outer stack areas. The resulting structure is shown in FIGS. 6A, 6B and 6C.

After photoresist 38 is removed, an etch, such as a polysilicon or silicon etch, depending on the material of conductive layer 14, is performed to remove the exposed portions of conductive layer 14 (in the inner and outer stack areas) and oxide layer 12, which etch does not remove nitride layer 28 in HV/LV areas 4, 6, with the result that each spaced apart stack structure S1/S2 includes a block of conductive material 14a from the remains of conductive layer 14 that are maintained in the MC area 2 under stacks S1 and S2 and spacers 32, 34, 36, which block of conductive material 14a is separated from substrate 10 by remaining portions of oxide layer 12. Block of conductive material 14a constitutes, and is also referred to herein as, floating gate 14a. Oxide spacers 40 are formed along the exposed ends of the block of conductive material 14a by oxide deposition and oxide anisotropic etch. Photoresist is formed on the structure and removed from the area between the stacks S1 and S2 (the inner stack area) in the MC area 2. An implantation process is performed to form source region 42 (also referred to herein as first source region) in the substrate between the stacks S1 and S2. An oxide etch is then used to remove oxide spacers 40 in the inner stack area to exposed ends of blocks of conductive material 14a. The resulting structure is shown in FIGS. 7A, 7B and 7C (after photoresist removal).

A tunnel oxide layer 44 is formed on the structure, including directly on the exposed ends of the blocks of conductive material 14a in the inner stack area. The tunnel oxide 44 could be oxide, oxidenitride or both, formed by deposition, thermal growth or both. Because of catalytic effects of the higher dopant levels in the source region 42, tunnel oxide 44 can have a thicker portion on the source region 42. A photolithographic masking operation is used to cover the HV and logic areas 4/6, and the inner stack area in the MC area 2, with photoresist. The outer stack areas are left exposed. An implant can be performed at this point for the portions of substrate 10 in the outer stack areas (i.e., those substrate portions that will be under the select gates to be formed later). An oxide etch can be used to remove any remaining portions of oxide layer 12 and tunnel oxide layer 44 in the outer stack areas and the HV and logic areas 4, 6. After photoresist removal, insulation layer 46 is then formed on the structure. Insulation layer 46 can be oxide, oxynitride or any other appropriate dielectric material, formed by deposition, thermal growth or both. The formation of insulation layer 46 thickens or becomes part of tunnel oxide 44 in the inner stack area, and is thus not shown separately. The resulting structure is shown in FIGS. 8A, 8B and 8C.

A conductive layer 48 (also referred to herein as third conductive layer) is formed on the structure. Conductive layer 48 can be polysilicon, either in-situ doped or undoped, and could instead be amorphous silicon. Doping and anneal would then be performed if undoped polysilicon or amorphous silicon is used for conductive layer 48. A chemical mechanical polish (CMP) or etch back is performed to planarize the top surface of the conductive layer 48. A further etch back process is used to recess the upper surface of conductive layer 48 below the tops of stacks S1 and S2, and remove conductive layer 48 from the HV and logic areas 4/6. An oxide layer 50 is formed over the structure, and planarized to be even with the tops of stacks S1 and S2 in the MC area 2, and removed entirely from the HV and logic areas 4/6. The resulting structure is shown in FIGS. 9A, 9B and 9C.

Figure 10B:
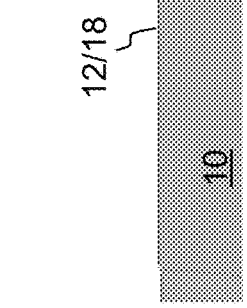
Figure 10C:
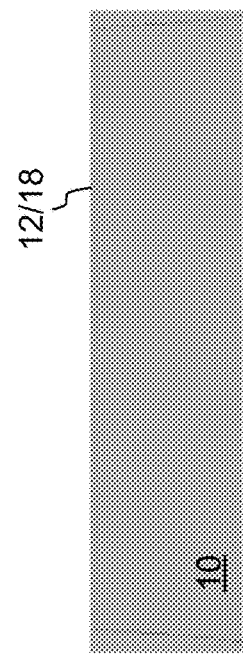

At this point, the majority of the memory cell formation is completed. The oxide 50 will protect the MC area 2 from subsequent processing in the HV and logic areas 4/6. A photolithographic masking operation is used to cover the MC area 2 with photoresist, while leaving the HV and logic areas 4/6 exposed. One or more etches are used to remove nitride layer 28, oxide layer 27, conductive layer 26 and insulation layer 24 in the HV and logic areas 4/6, as shown in FIGS. 10A, 10B and 10C (after photoresist removal).

Implantations can be performed at this time to form doped P and N wells in the substrate 10 in the HV and logic areas 4/6. The MC and logic areas 2/6 are covered by photoresist, and an oxide etch is used remove oxide layers 12/18 from the HV area 4, leaving substrate 10 exposed. An oxide layer 52 is formed on the substrate 10 in the HV area 4. After photoresist removal, a layer of high-K insulation material 54 is formed on the oxide layer 50 in the MC area 2, the oxide layer 52 in the HV area 4, and on the oxide layers 12/18 in the logic area 6. High-K insulation materials are insulation materials that have a dielectric constant K greater than that of silicon dioxide. Examples of high-K insulation materials include $HfO_2$, $ZrO_2$, $TiO_2$, $Ta_2O_5$, and combinations thereof. A titanium nitride (TiN) layer 56 is formed on the high-K insulation layer 54. The resulting structure is shown in FIGS. 11A, 11B and 11C.

Figure 12A:
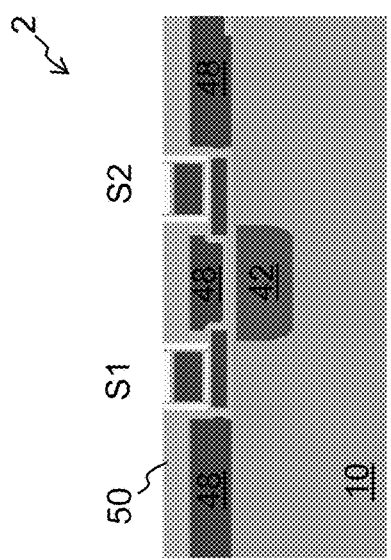
Figure 12B:
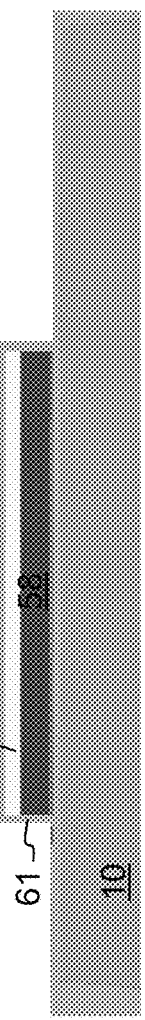
Figure 12C:
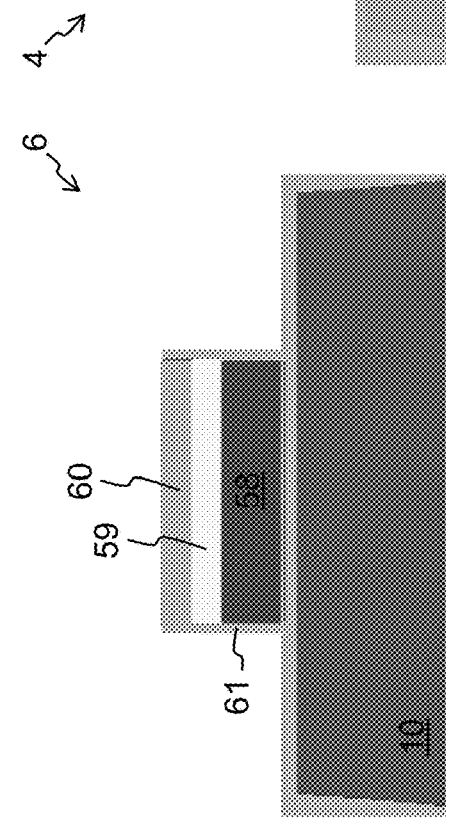

A layer of dummy conductive material is then formed over the structure, which can be formed of polysilicon. An insulation layer 59 (also referred to herein as a logic insulation layer 59) such as a nitride, and a hard mask layer 60 such as an oxide, are then respectively formed on layer of dummy conductive material. A photolithography masking operation is used to cover select portions of the HV and logic areas 4/6 with photoresist, leaving the entire MC area 2 exposed. One or more etches are then used to remove the exposed areas of the hard mask layer 60, insulation layer 59, layer of dummy conductive material and high-K layer 54 in the MC, HV, and logic areas 2/4/6, leaving behind blocks of dummy conductive material 58 covered with insulation layer 59 and hard mask layer 60 in the HV and logic areas 4/6. After photoresist removal, oxide spacers 61 are formed by oxide deposition and etch. Implantations into the substrate 10 in the logic area 6 can be performed at this time. The resulting structure is shown in FIGS. 12A, 12B and 12C.

Figure 13A:
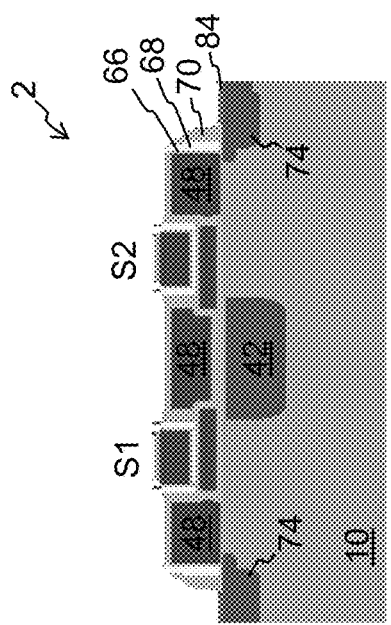
Figure 13B:
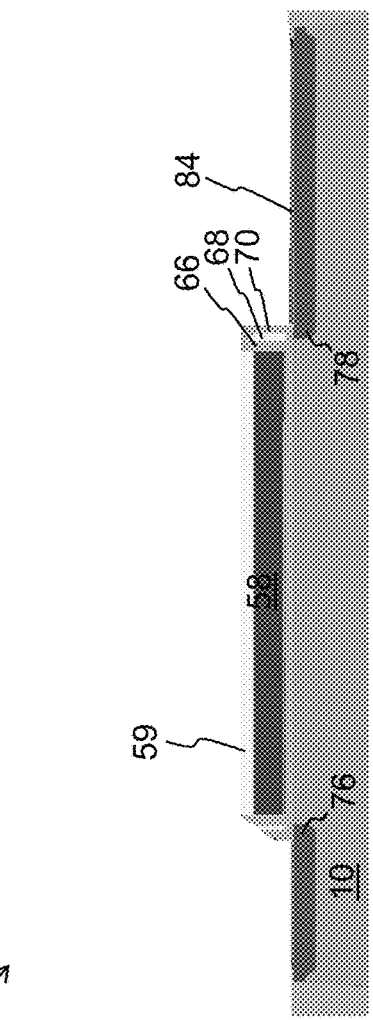
Figure 13C:
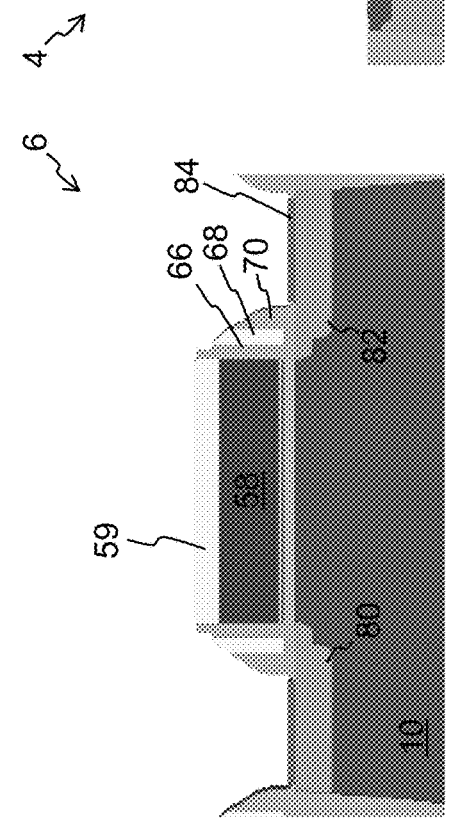

A photolithography masking operation is used cover the HV and logic areas 4/6, and portions of the MC area 2, with photoresist (i.e., cover the inner stack area, stack structures S1 and S2, and those portions of the outer stack areas immediately adjacent stack structures S1 and S2). Etches are used to remove exposed portions of oxide layer 50 and conductive layer 48. After photoresist removal, additional selective implantations and etches can be performed in the different exposed portions of substrate 10 (i.e., by additional photolithography mask operations and implantations such as LDD implants). Oxide spacers 66 are formed by oxide deposition and etch, and nitride spacers 68 are formed by nitride deposition and etch, and oxide spacers 70 are formed by oxide deposition and etch. One or more implantations are performed to form drain regions 74 (also referred to herein as first drain regions) in the substrate adjacent the oxide spacers 70 in the MC area 2, source and drain regions 76/78 (also referred to herein as second source regions and second drain regions) adjacent the oxide spacers 70 in the HV area 4, and source and drain regions 80/82 (also referred to herein as third source regions and third drain regions) adjacent the oxide spacers 70 in the logic area 6. After a further oxide etch, silicide 84 (also referred to as salicide which is self-aligned silicide) is then formed on the source regions 76/80 and drain regions 74/78/82 by metal deposition (e.g., NiPt) and anneal. The resulting structure is shown in FIGS. 13A, 13B and 13C.

An insulation layer 86 (e.g., nitride) is formed over the structure. A relatively thick layer of inter-layer dielectric (ILD) insulation material 88 (e.g., oxide) is then formed on layer 86. CMP is performed to planarize and recess the layer of ILD insulation material 88, and remove nitride layer 59 to expose dummy conductive layer 58 in the HV and logic areas 4/6. An etch, such as a polysilicon etch, is then used to remove the blocks of dummy conductive material remaining from layer 58 in the HV and logic areas 4/6. A layer of metal material such as Al, Ti, TiAlN, TaSiN, TaN, TiN, or other appropriate metal material, without limitation, or a composite thereof, is formed over the structure. A CMP is then performed to remove portions of the metal material layer, leaving blocks of metal material 92 in the HV and logic areas 4/6 (i.e., replacing the blocks of dummy conductive material 58 with blocks of metal material 92). A nitride layer 94 is formed over the structure. A relatively thick layer of oxide 96 is formed over the structure, followed by a chemical mechanical polish (CMP) or etch back to planarize the top surface of the structure. Contact holes are then formed through the oxide layer 96, nitride layer 94, oxide layer 88 and nitride layer 86 to expose the silicide 84 on the source regions 76/80 and drain regions 74/78/82. The contact holes are filled with a TiN liner layer 98 and a metal material 100 (e.g., Tungsten). The final structure is shown in FIGS. 14A, 14B and 14C.

Figure 15:
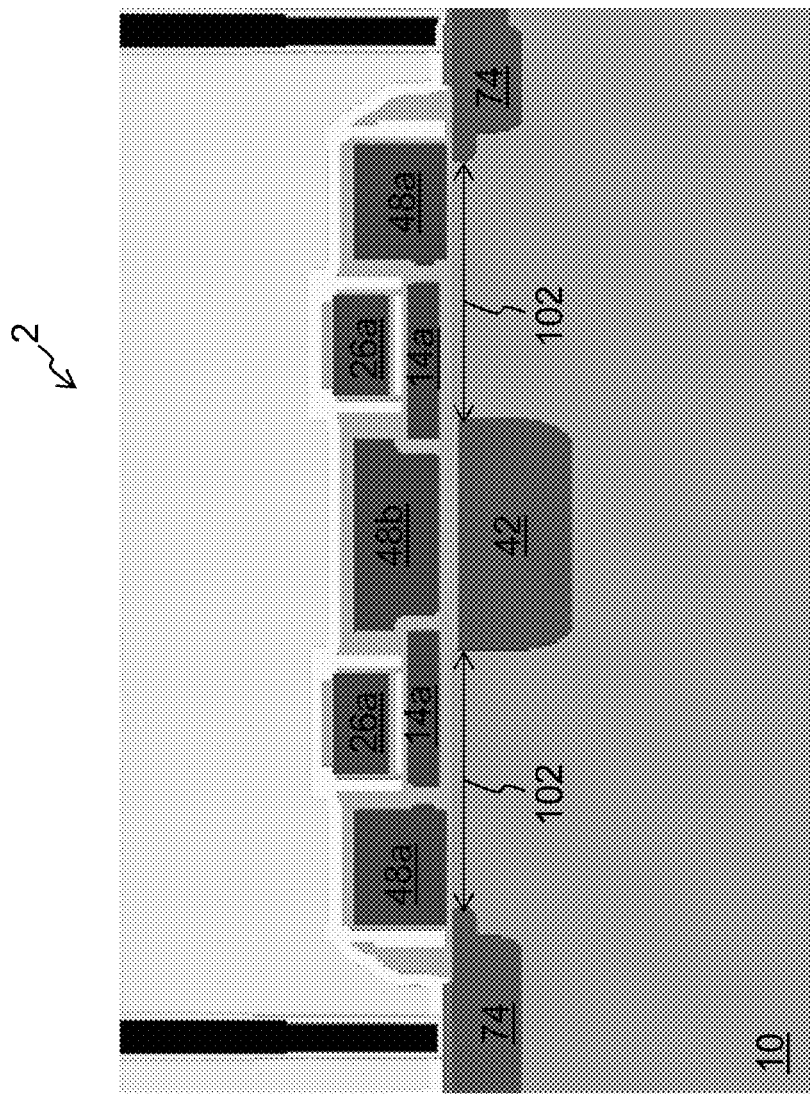
FIG. 15 is a cross sectional view of the memory cell area showing the finished memory cells.

FIG. 15 shows the final memory cell structure in the MC area 2, which includes pairs of memory cells each sharing a source region 42 spaced apart from two drain regions 74, with channel regions 102 in the silicon 10 extending there between. Each memory cell includes a floating gate 14a (i.e., a block of conductive material remaining from conductive layer 14) disposed over and insulated from a first portion of the channel region 102 for controlling the conductivity thereof, a select gate 48a (i.e., which can also be referred to a word line gate, and is a block of conductive material remaining from conductive layer 48) disposed over and insulated from a second portion of the channel region 102 for controlling the conductivity thereof, a control gate 26a (i.e., a block of conductive material remaining from conductive layer 26) disposed over and insulated from the floating gate 14a, and an erase gate 48b (i.e., a block of conductive material remaining from conductive layer 48) disposed over and insulated from the source region 42 (shared by the pair of memory cells). The pairs of memory cells can be arranged in an array of memory cells arranged in rows and columns. The pairs of memory cells can extend end to end in a column direction (i.e., a bit line direction), with STI oxide 22 disposed between adjacent columns. A row of the control gates 26a can be formed as a continuous control gate line that connects the control gates 26a together for an entire row of the memory cells. A row of the select gates 48a are formed as a continuous select gate line (also known as a word gate line) that connects the select gates 48a together for an entire row of the memory cells. A row of the erase gates 48b are formed as a continuous erase gate line that connects the erase gates 48b together for an entire row of pairs of the memory cells.

Figure 16:
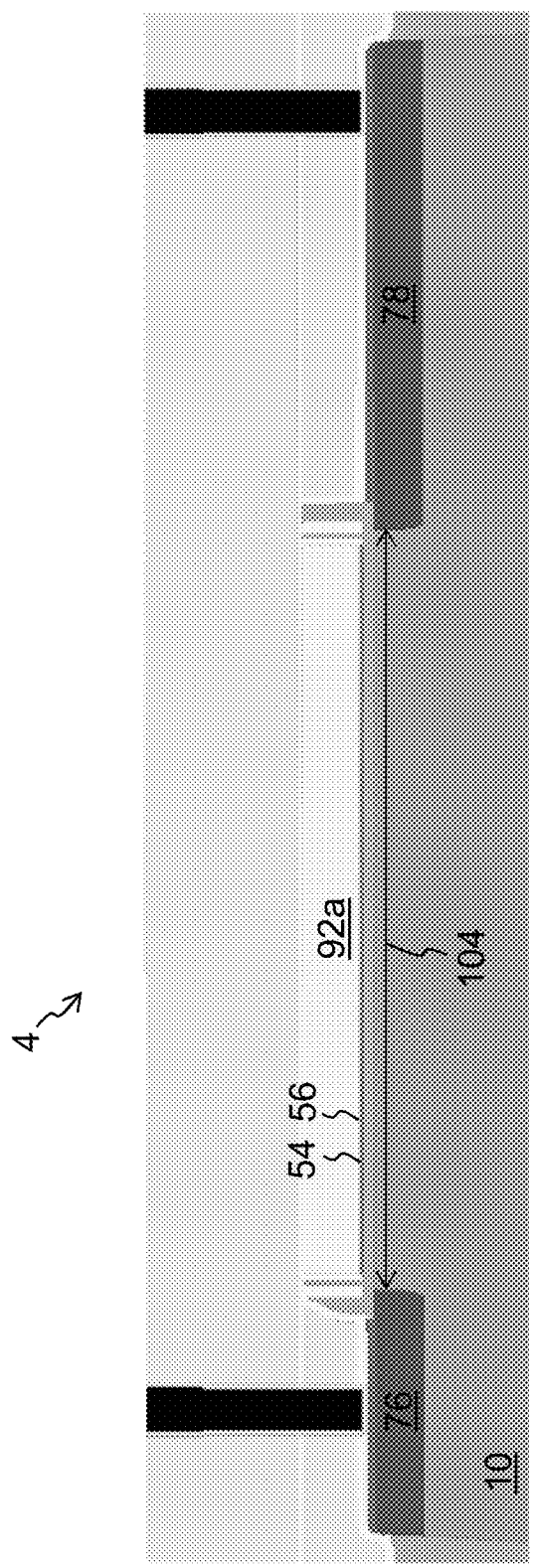
FIG. 16 is a cross sectional view of the HV area showing the finished HV devices.

The final HV devices are shown in FIG. 16. Each HV device includes spaced apart source and drain regions 76 and 78 with a channel region 104 of the silicon substrate 10 extending there between. An HV gate 92a (i.e., a block of the metal material remaining from the layer of metal material layer) is disposed over and insulated from the channel region 104 for controlling the conductivity thereof.

Figure 17:
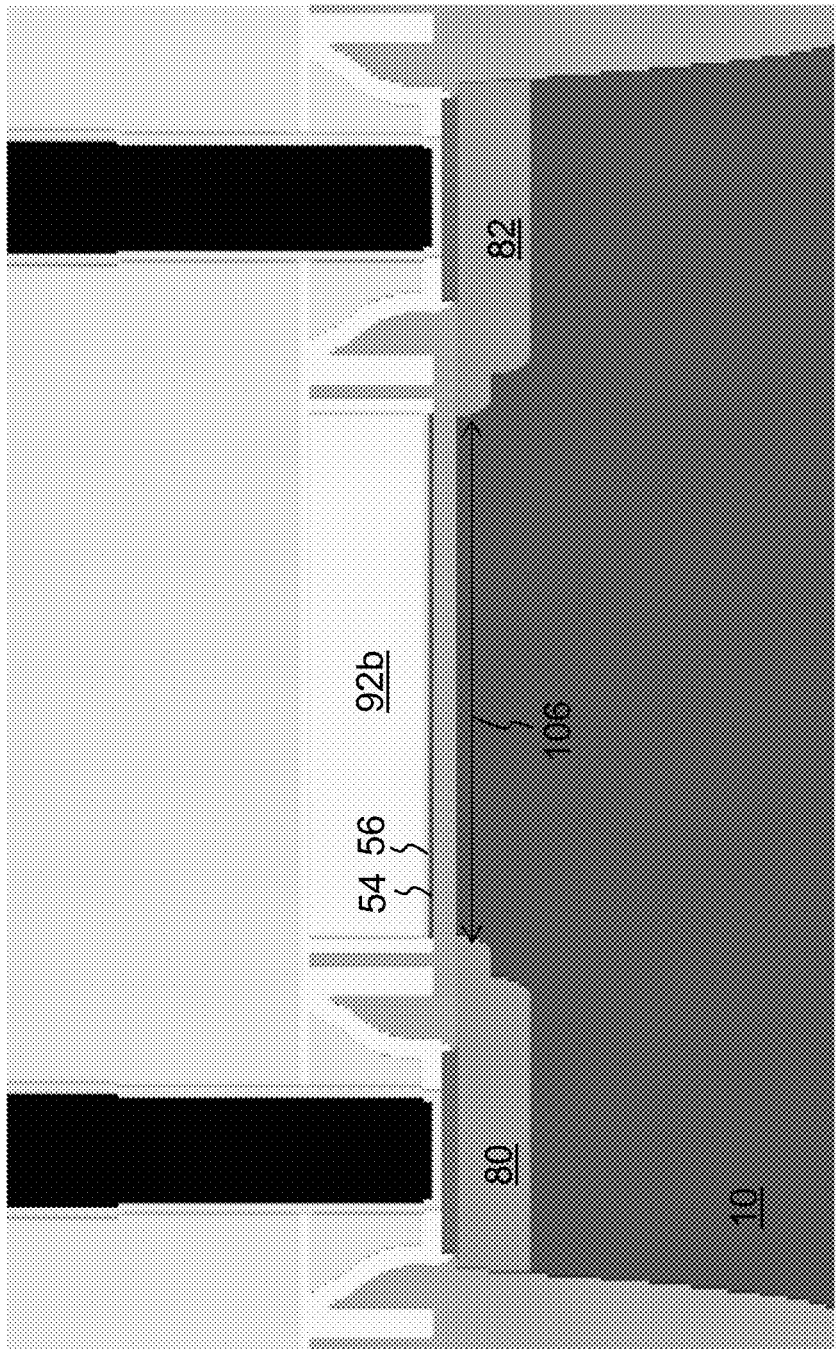
FIG. 17 is a cross sectional view of the logic area showing the finished logic devices.

The final logic devices are shown in FIG. 17. Each logic device includes spaced apart source and drain regions 80 and 82 with a channel region 106 of the silicon substrate 10 extending there between. A logic gate 92b (i.e., a block of the metal material remaining from the layer of metal material) is disposed over and insulated from the channel region 106 for controlling the conductivity thereof.

There are a number of advantages of the above described method of forming memory cells, HV devices and logic devices on the same substrate. The memory cell formation is substantially completed before the metal HV and logic gates 92a and 92b are formed in the HV and logic areas 4/6, so that the metal HV and logic gates 92a/92b will not be adversely affected by the formation of the memory cells. The process operations for the formation of the gates in the MC area 2 are separate and independent from (and can be customized relative to) the process operations for the formation of the gates in the HV and logic areas 4/6. The MC areas 2 are covered after most of the memory cell formation is completed and before the processing in the HV and logic areas 4/6 (i.e., before the removing of the layers in the HV and logic areas 4/6 that resulted from the memory cell formation, and before the depositing and removing of the layers used for forming the HV devices and logic devices including dummy polysilicon removal, without limitation). The upper surface 10a of the substrate 10 is recessed in the MC and HV areas 2/4 relative to that in the logic area 6 to accommodate the taller structurers in the MC/HV areas 2/4 (i.e., so that tops of the shorter logic devices in the logic area 6 are approximately even with the tops of the taller memory cells and HV devices in the MC/HV areas 2/4, and so that CMP across all three areas can be used for processing. Silicide 84 enhances the conductivity of the drain regions 74, and source/drain regions 76/78, source/drain regions 80/82. The memory cell select gates 48a and memory cell erase gates 48b are formed using a single conductive material deposition (i.e., a single polysilicon layer formed by a single polysilicon deposition can be used to form both the select gates 48a and the erase gates 48b). The thicknesses of the various layers 46, 12, 18, 52 and 54 (which are used as gate insulators) are independent of each other with each sized for its respective gate operation. For example, insulation layer 46 under the select gates 48a can be thinner than oxide layer 12 under the floating gates 14a.

The CMP used to planarize conductive layer 48 with the tops of the stack structures S1 and S2, followed by an etch to recess the conductive layer 48 below the tops of the stack structures S1 and S2 (see FIGS. 9A-9C and related descriptions), provides reliable control of the height of conductive layer 48 in the MC area 2 (e.g., using APC (auto process control) to measure the conductive layer 48 thickness before etch process, and then derive the etch time based on etch rate of the etch), thus avoiding an additional masking operation.

Figure 18:
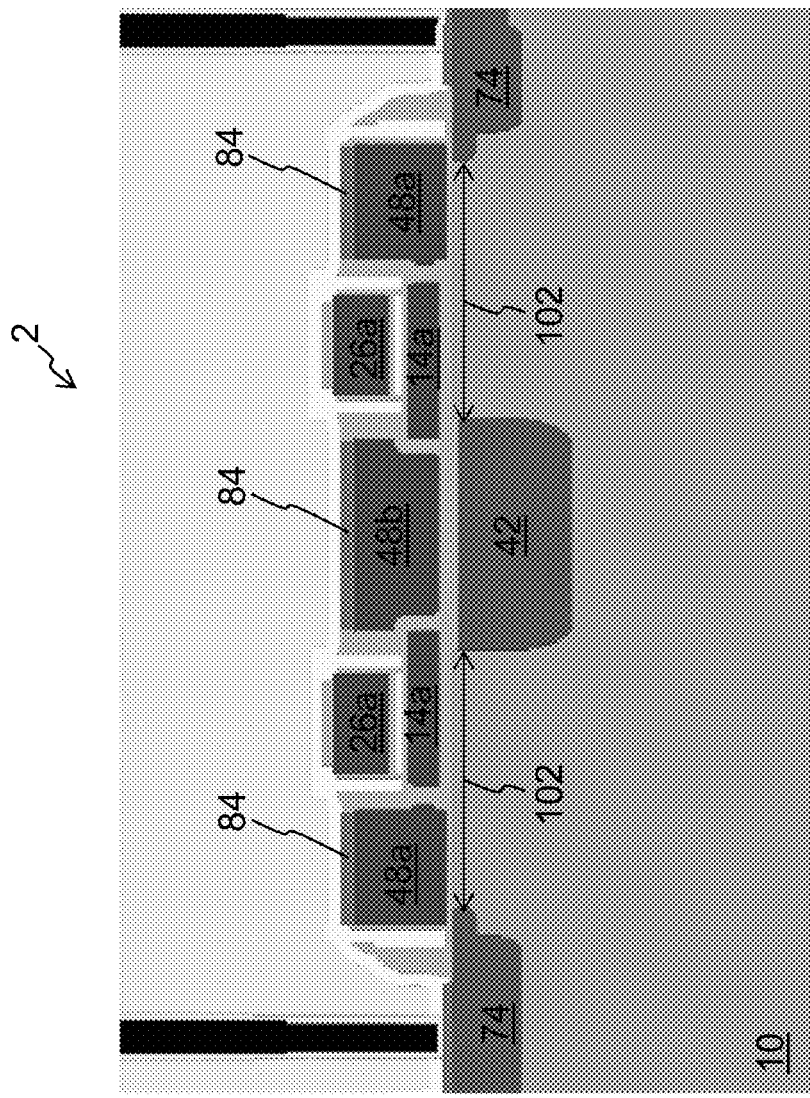
FIG. 18 is a cross sectional views of the memory cell area showing an alternate example.

FIG. 18 shows an alternate example, where silicide 84 is also formed on the top surfaces of select gates 48a and erase gate 48b, for increased conductivity of these gates and gate lines. Silicide 84 can be formed on select gates 48a and erase gate 48b by exposing the top surfaces of these gates (i.e., removing the oxide on top surface of select/erase gates 48a/48b using an oxide etch) before silicide 84 is formed on the source and drain regions (see FIGS. 13A-13B).

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method operations need be performed in the exact order illustrated or claimed, but rather in any order (unless there is an explicitly recited limitation on any order) that allows the proper formation of the memory cell area, the HV area and the logic area described herein. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
   providing a substrate of semiconductor material that includes a first area, a second area and a third area;
   recessing an upper surface of the substrate in the first area and an upper surface of the substrate in the second area, relative to an upper surface of the substrate in the third area;
   forming a first conductive layer disposed over and insulated from the upper surfaces in the first area, the second area and the third area;
   removing the first conductive layer from the second area and the third area;
   forming an insulation layer on the first conductive layer in the first area and over the upper surfaces in the second area and the third area;
   forming a second conductive layer on the insulation layer in the first area, the second area and the third area;
   performing one or more etches to selectively remove portions of the first and second conductive layers in the first area, while maintaining the second conductive layer in the second area and the third area, wherein the one or more etches result in pairs of stack structures in the first area with the respective stack structures including a control gate of the second conductive layer disposed over and insulated from a floating gate of the first conductive layer;
   forming first source regions in the substrate of the first area, respective first source regions disposed between respective pairs of stack structures;
   forming a third conductive layer disposed over and between the stack structures in the first area, and in the second area and the third area;
   performing a chemical mechanical polish or etch back to planarize an upper surface of the third conductive layer;
   performing an etch to recess the upper surface of the third conductive layer below tops of the stack structures in the first area, and to remove the third conductive layer from the second area and the third area, leaving a plurality of erase gates of the third conductive layer respectively disposed over and insulated from one of the first source regions in the first area;
   removing the second conductive layer from the second area and the third area;
   after the removing of the second conductive layer from the second area and the third area, forming blocks of dummy conductive material disposed over and insulated from the upper surfaces in the second area and the third area;
   after the forming of the blocks of dummy conductive material in the second area and the third area, etching portions of the third conductive layer in the first area to form a plurality of select gates of the third conductive layer each disposed adjacent to one of the stack structures;
   forming first drain regions in the substrate of the first area, the first drain regions respectively adjacent to one of the select gates;
   forming second source regions in the substrate, the second source regions respectively adjacent one of the blocks of dummy conductive material in the second area;
   forming second drain regions in the substrate, the second drain regions respectively adjacent one of the blocks of dummy conductive material in the second area;
   forming third source regions in the substrate, the third source regions respectively adjacent one of the blocks of dummy conductive material in the third area;
   forming third drain regions in the substrate, the third drain regions respectively adjacent one of the blocks of dummy conductive material in the third area; and replacing the blocks of dummy conductive material in the second area and in the third area with blocks of metal material while maintaining the erase gates of the third conductive layer in the first area and the select gates of the third conductive layer in the first area.

2. The method of claim 1, comprising:
forming a hard mask insulation layer on the first conductive layer in the first area and over the upper surfaces in the second area and the third area;
forming trenches through the hard mask insulation layer and into the substrate in the second area and the third area, and through the hard mask insulation layer and the first conductive layer and into the substrate in the first area;
filling the trenches with insulation material; and
after the filling of the trenches, removing the hard mask insulation layer from the first area, the second area, the third area.

3. The method of claim 1, comprising:
forming a layer of high-K insulation material over the upper surfaces in the second area and the third area, wherein the blocks of dummy conductive material are formed on the layer of high-K insulation material in the second area and the third area.

4. The method of claim 1, wherein the first conductive layer, the second conductive layer and the third conductive layer are respectively formed of polysilicon or amorphous silicon.

5. The method of claim 1, comprising:
forming silicide on the first, second and third drain regions and on the second and third source regions.

6. The method of claim 4, comprising:
forming silicide on the select gates and the erase gates.

7. The method of claim 1, wherein the insulation layer includes oxide, nitride and oxide sublayers, such that for each of the stack structures, the control gate is insulated from the floating gate by the oxide, nitride and oxide sublayers.

8. The method of claim 1, wherein the forming of the blocks of dummy conductive material includes forming a logic insulation layer on the blocks of dummy conductive material and a hard mask layer on the logic insulation layer.

* * * * *